US011412638B2

(12) United States Patent
Chen et al.

(10) Patent No.: US 11,412,638 B2
(45) Date of Patent: Aug. 9, 2022

(54) COOLING FOR SERVER WITH HIGH-POWER CPU

(71) Applicant: Quanta Computer Inc., Taoyuan (TW)

(72) Inventors: Yi-Chieh Chen, Taoyuan (TW); Yueh-Chang Wu, Taoyuan (TW); Yan-Kuei Chen, Taoyuan (TW); Te-Chuan Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 2 days.

(21) Appl. No.: 17/247,149

(22) Filed: Dec. 1, 2020

(65) Prior Publication Data

US 2022/0174845 A1 Jun. 2, 2022

(51) Int. Cl.
*H05K 7/20* (2006.01)
*G06F 1/20* (2006.01)

(52) U.S. Cl.
CPC ..... *H05K 7/20809* (2013.01); *H05K 7/20327* (2013.01); *H05K 7/20336* (2013.01); *H05K 7/20436* (2013.01); *G06F 1/20* (2013.01); *G06F 2200/201* (2013.01)

(58) Field of Classification Search
CPC ...... G06F 1/20; G06F 1/203; G06F 2200/201; H05K 7/20336; H05K 7/2039; H05K 7/20809; H05K 7/208; H05K 7/20327; H05K 7/20436; H05K 7/20445
See application file for complete search history.

(56) References Cited

U.S. PATENT DOCUMENTS

| | | | |
|---|---|---|---|
| 10,571,199 B2* | 2/2020 | Ito | F28D 15/02 |
| 2018/0292872 A1* | 10/2018 | Fu | G06F 1/206 |
| 2019/0289752 A1* | 9/2019 | Ma | H05K 7/2029 |
| 2020/0217599 A1* | 7/2020 | Narasimhan | F28F 3/086 |
| 2021/0274685 A1* | 9/2021 | Bhatia | H05K 7/20772 |

FOREIGN PATENT DOCUMENTS

CN 202870718 U * 4/2013
CN 203241901 U * 10/2013

* cited by examiner

*Primary Examiner* — Adam B Dravininkas
(74) *Attorney, Agent, or Firm* — Nixon Peabody LLP

(57) ABSTRACT

A cooling system for an electronic device includes a central processing unit (CPU), a remote heat sink, and a heat-pipe module. The CPU is mounted on a base of the electronic device, and the remote heat sink receives heat generated by the CPU. The heat-pipe module has a plurality of heat pipes for transferring the heat generated by the CPU to the remote heat sink. Each heat pipe has a circular section extending between a first end and a second end. The first end has a flattened, non-circular shape, and is coupled to the base near the CPU. The second end is coupled to the remote heat sink. The first end of each heat pipe is in direct contact with at least another first end of an adjacent heat pipe.

20 Claims, 11 Drawing Sheets

| Heat-pipe diameter | D8 | | | | | D6 |
|---|---|---|---|---|---|---|
| Solution | D8*8 | D8*7 | D8*6 | D8*5 | D8*4 Round & Straight | D6*6 Round & Straight |
| Heat-pipe Quantity | 8 | 7 | 6 | 5 | 4 | 6 |
| Heat-pipe flatten | YES to 4.5mm | YES to 5mm | YES to 6mm | YES to 7mm | No. still 8 mm | No. still 6mm |
| Heat-pipe bending angle | 90 | | | | | |
| Heat-pipe length | 250mm | | | | | |
| Rca | 0.0819 | 0.0890 | 0.0950 | 0.1014 | 0.1043 | 0.1000 |
| Total Qmax(W) | 405.6 | 361.2 | 320.4 | 276 | 228 | 258 |
| Pass or Fail (Qmax>350W~Pass) | Pass | Margin Pass | FAIL | FAIL | FAIL | FAIL |

FIG. 1

| Item | CFM | 350W SMILING POND 4 TTV | | | |
|---|---|---|---|---|---|
| | | Tc | Ta | Power | R值 |
| Original-8pcs HP | 60 | 54.1 | 22.4 | 352.2 | 0.0900 |
| 6pcs HP | | 60.2 | 22.1 | 349.2 | 0.1091 |
| 5pcs HP | | 69.6 | 22.0 | 341.6 | 0.1393 |
| 4 pcs HP | | 78.0 | 22.1 | 288.4 | 0.1938 |

COOLING FOR SERVER WITH HIGH-POWER CPU

FIELD OF THE INVENTION

The present invention relates generally to a server thermal design, and more specifically, to cooling a high-power central processing unit ("CPU") using a heat-pipe arrangement.

BACKGROUND OF THE INVENTION

In recent years, server systems require increasingly higher performance computing. A higher performance CPU typically requires higher power dissipation. For example, for the latest Intel platform—Eagle Stream Platform—the maximum CPU power dissipation of an air cooling stock keeping unit (SKU) will increase to approximately 350~400 Watts ("W"). Previously, the maximum CPU power dissipation was much lower, e.g., less than 300 W. To have sufficient air cooling capability, designers will use enhanced volume air cooling ("EVAC") instead of a standard, standalone heat sink as a thermal solution.

The EVAC requires conducting, via a fluid interface, heat generated by the CPU to a remote heat sink. The EVAC system can be a heat pipe, a thermal syphon, or a liquid cooling device. Heat pipes are the most popular cooling conduit for this type of EVAC design. Additionally, the heat pipes play an important role for heat transfer between a condenser element and an evaporator element.

Each heat pipe has a maximum amount of heat Qmax that it can carry. The Qmax is typically expressed in watt units (W). The heat pipe has an internal wick structure that drives a return liquid. One problem associated with the increased maximum heat Qmax of present electronic devices, such as servers, is that the fluid flow is too slow. Specifically, when the maximum heat Qmax is too great, fluid flow is too slow returning from a condenser side to an evaporator side of the heat pipe. Consequently, the fluid within the heat pipe dries out, which results in the heat pipe losing its heat transportation function. Some of present cooling heat pipes that exhibit this type of problem include a circular pipe having a 6 millimeter (mm) diameter.

The present disclosure is directed to a cooling system that, among other benefits, provides a solution to increased heat produced in an electronic device.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a cooling system for an electronic device includes a central processing unit (CPU), a remote heat sink, and a heat-pipe module. The CPU is mounted on a base of the electronic device, and the remote heat sink receiving heat generated by the CPU. The heat-pipe module has a plurality of heat pipes for transferring the heat generated by the CPU to the remote heat sink. Each heat pipe has a circular section extending between a first end and a second end. The first end has a flattened, non-circular shape, and is coupled to the base near the CPU. The second end is coupled to the remote heat sink. The first end of each heat pipe is in direct contact with at least another first end of an adjacent heat pipe.

According to a configuration of the above implementation, the plurality of heat pipes includes eight heat pipes.

According to another configuration of the above implementation, each one of the plurality of heat pipes includes an internal wick structure that transfers heat between the first end and the second end. The internal wick structure including a liquid.

According to an aspect of the above configuration, in response to the heat produced by the CPU, the first end evaporates, at least in part, the liquid into vapor. The second end condenses the vapor into liquid. The internal wick structure transmits the vapor and liquid between the first end and the second end.

According to another configuration of the above implementation, the first end of each heat pipe has a width W1 of approximately 4.5 millimeters (mm).

According to another configuration of the above implementation, a cumulative width WT for all first ends of the plurality of heat pipes is less than approximately 38.2 millimeters (mm).

According to another configuration of the above implementation, the heat is in the range of about 350-400 watts.

According to another configuration of the above implementation, the heat-pipe module has a thermal resistance R of about 0.09 or less.

According to another configuration of the above implementation, each heat pipe having a length LP that extends between the CPU and the remote heat sink along an X-axis. The circular section has a cross-section with a diameter D. The first end has a width W1 that extends along a Y-axis. The width W1 of the first end is less than the diameter D. The first end has a height H1 that extends along a Z-axis, which is perpendicular to the Y-axis.

According to an aspect of the above configuration, the length LP is approximately 250 millimeters (mm), the width W1 is approximately 4.5 mm, the diameter D is approximately 8 mm, and the height H1 is approximately 10.55 mm.

According to another aspect of the above configuration, a copper block is mounted between the first end of the heat-pipe module and the CPU. The copper block has a plurality of channels for receiving, respectively, the plurality of heat pipes.

According to an embodiment of the above aspect, the copper block is in direct contact with the first end of the heat-pipe module and the CPU.

According to another embodiment of the above aspect, each channel of the plurality of channels has a cross-sectional profile in the form of a half-circle.

According to another configuration of the above implementation, the second end has a flattened, non-circular shape. The second end has a width W2 that extends along a Y-axis. The second end further has a height H2 that extends along a Z-axis, which is perpendicular to the Y-axis. The width W2 of the second end is greater than the height H2 of the second end.

According to another aspect of the present disclosure, a cooling system for an electronic device includes a central-processing unit (CPU) that generates heat. The cooling system further includes a base in which the CPU is positioned. The base includes a mounting space above the CPU. The mounting space has a width WM that extends along a Y-axis. The width WM of the mounting space is approximately 38 millimeters (mm). The cooling system further includes a heat sink for receiving heat generated by the CPU, and a heat-pipe module having eight individual heat pipes. Each heat pipe has a first end that is attached within the mounting space. The first end has a non-circular shape. Each heat pipe has a circular section that connects the first end to a second end. The second end is attached to the heat sink.

According to a configuration of the above implementation, the first end has a width W1 that extends along the Y-axis. The first end further has a height H1 that extends a Z-axis. The Z-axis is perpendicular to the Y-axis. The width W1 of the first end is smaller than the height H1 of the first end.

According to another configuration of the above implementation, the second end has a non-circular shape. The second end has a width W2 that extends along the Y-axis. The second end has a height H2 that extends along the Z-axis. The width W2 of the second end is greater than the height H2 of the second end.

According to another configuration of the above implementation, the first end is attached to the mounting space in direct contact with the CPU.

According to another configuration of the above implementation, a copper block is mounted between the first end of each heat pipe and the CPU. The copper block distributes the heat generated by the CPU to the first end of each heat pipe.

According to another configuration of the above implementation, the first end of each heat pipe is in direct contact with at least one other first end of an adjacent heat pipe of the eight individual heat pipes.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

FIG. 1 is a table showing test results for heat-pipe modules with different parameters.

Figure 2:
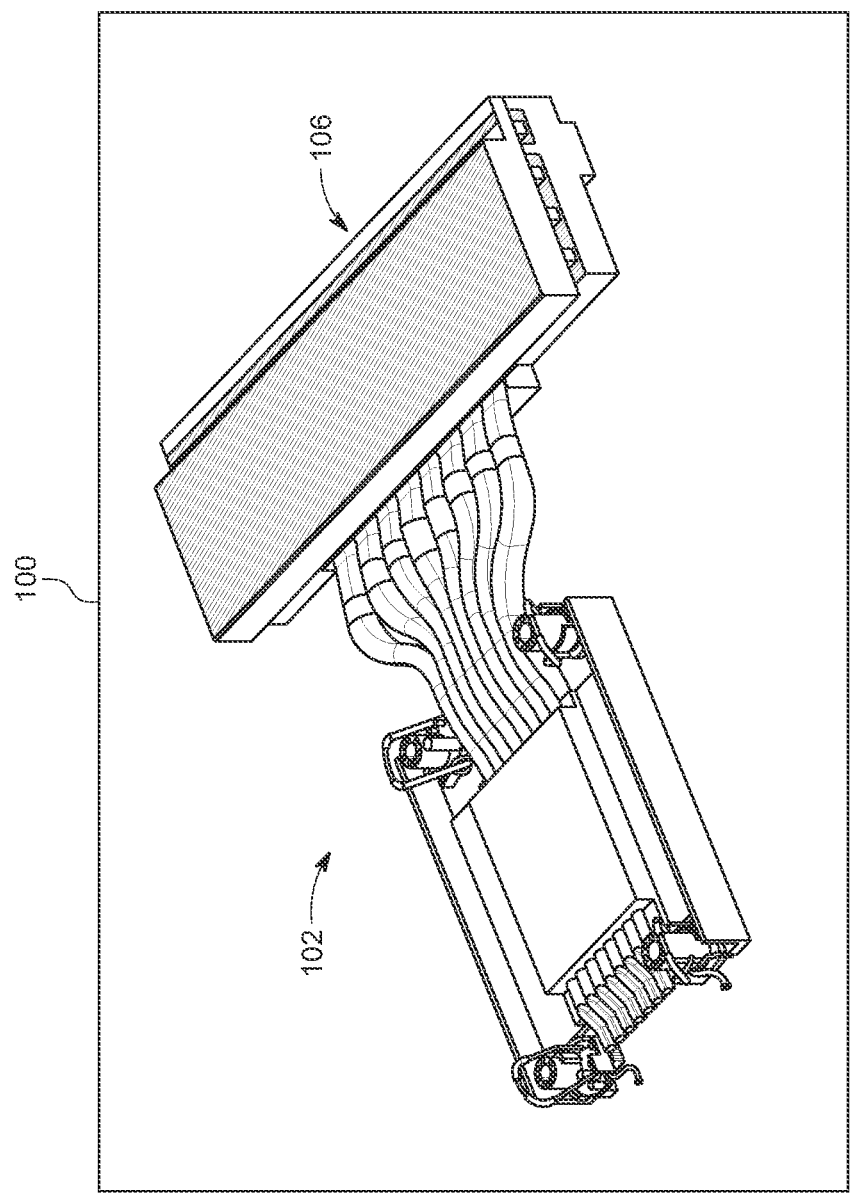
FIG. 2 is a perspective assembly view of a cooling system, in accordance with an embodiment of the present disclosure.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Generally, referring to an exemplary embodiment, a cooling system is configured to adequately transfer heat generated by a 350 W CPU of a one rack unit ("1 U") server system. The cooling system includes a heat module with 8 heat pipes, each heat pipe having a diameter of about 8 mm. The cooling system is able to carry about 350 W-400 W of heat generated by the CPU, with 400 W provide a safety margin above the typically expected 350 W.

Referring by way of example to the Eagle Stream Platform, an available mounting space for heat pipes is limited to approximately 38.2 mm. This mounting space is insufficient for connecting the 8 heat pipes without any post manufacturing modifications. In other words, the total space required by the 8 heat pipes—with each heat pipe having a diameter of 8 mm—is 64 mm. Clearly, the available mounting space of 38.2 mm is insufficient to accommodate the 64 mm total space required by the 8 heat pipe. The present disclosure provides a solution in which the heat pipes are properly accommodated in the available mounting space.

Furthermore, as illustrated in FIG. 1, when a cooling system for a 350 W CPU uses less than 8 heat pipes, the smaller number of heat pipes may cause the heat pipes to dry out because the total Qmax is lower than the required 350 W-400 W design power. Additionally, the thermal resistance (Rca) of the heat pipes is higher as well, with the thermal resistance Rca=(CPU case temperature−local ambient temperature)/CPU power. The thermal resistance Rca is a performance index. The heat-pipe diameter is selected to be 8 mm for configuration solutions ranging between 4-8 heat pipes, and 6 mm for a configuration solution having 6 heat pipes.

To add a sufficient number of heat pipes in the limited available space, the heat pipes must be stacked. However, the stacked heat pipes have a higher contact resistance between each upper and lower heat pipes, which results in a worse, inadequate thermal performance. Thus, the present disclosure provides a solution in which the disclosed cooling system provides good thermal performance for a 350 W CPU. For example, the cooling system includes 8 heat pipes with individual diameters of 8 mm, each of the 8 heat pipes have a shaped end that facilitates the 8 heat pipes being accommodated in the available mounting space.

Accordingly, the present disclosure describes a cooling system and method in which 8 heat pipes are connected within a 38.2 mm mounting space. The 8 heat pipes are sized and shaped to solve the heat transfer for a 350 W~400 W CPU in a 1 U server system. By way of example, the heat pipes are formed with a flattened end that reduces the general circular dimension of each heat pipe. The flattened end is shaped and dimensioned for allowing all the heat pipes to fit in the available mounting space.

The present disclosure further describes an optional copper block that generally facilitates uniform heat transfer between the CPU and the heat pipes. The copper block is in direct contact with both the CPU and the heat pipes, having a semicircular shape to accommodate the flattened end of each heat pipe.

Figure 3:
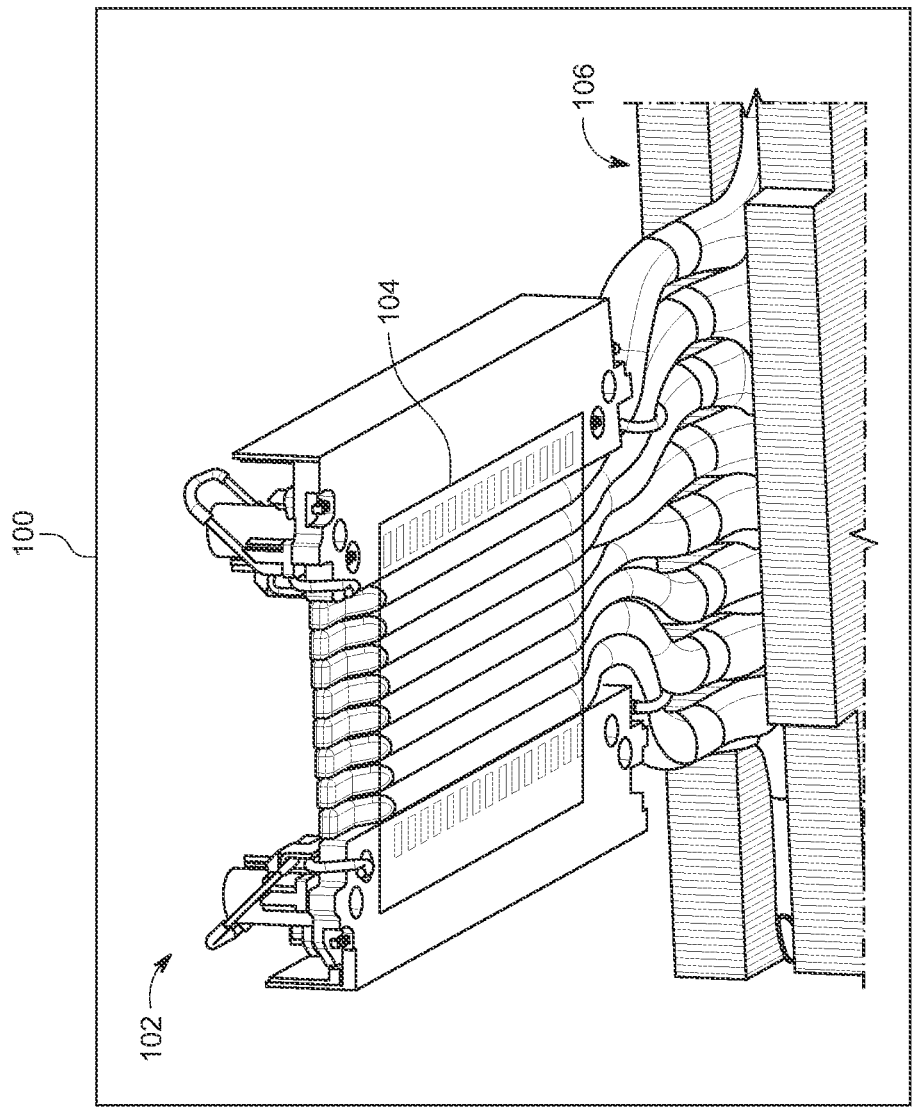
FIG. 3 is a perspective exploded view of the cooling system shown in FIG. 2.

Referring to FIGS. 2 and 3, an electronic device 100, such as 1 U server system, includes a cooling system 102, a CPU 104 (illustrated only in FIG. 3), and a remote heat sink 106. The cooling system facilitates adequate heat transfer from the CPU 104 and the remote heat sink 106.

Figure 4:
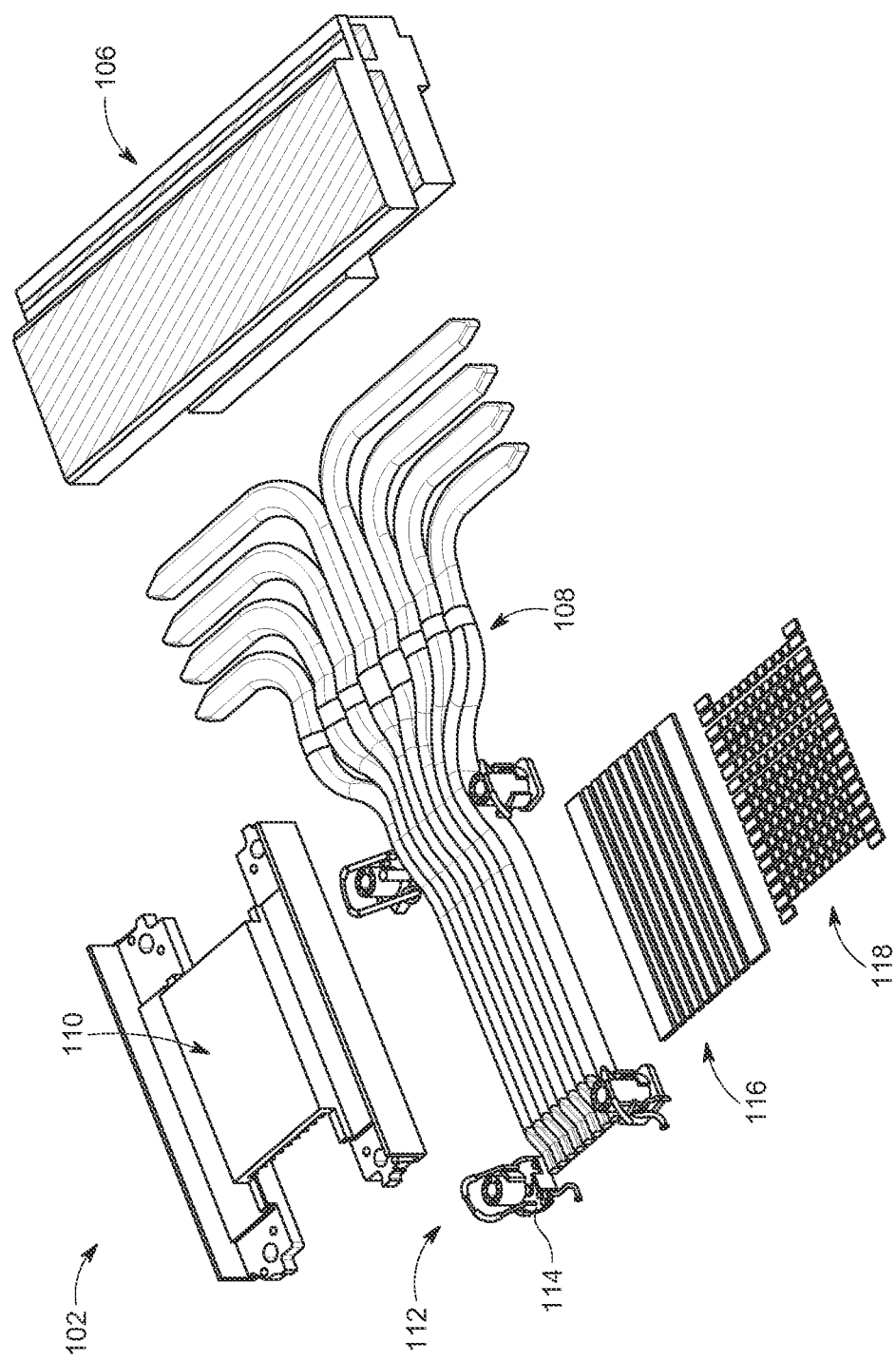
FIG. 4 is a bottom perspective assembly view of the cooling system shown in FIG. 2.

Referring to FIG. 4, the cooling system 102 includes a heat-pipe module 108 that is coupled between a base 110 and the remote heat sink 106. An anti-tilt system 112 is further coupled to the base 110, with four individual connectors 114. A copper block 116 is coupled to the base 110 below the heat-pipe module 108. A layer of grease 118 is provided on a bottom surface of the copper block 116 for further enhancing heat transmission between the copper block 116 and the CPU 104 (illustrated in FIG. 3).

Figure 5:
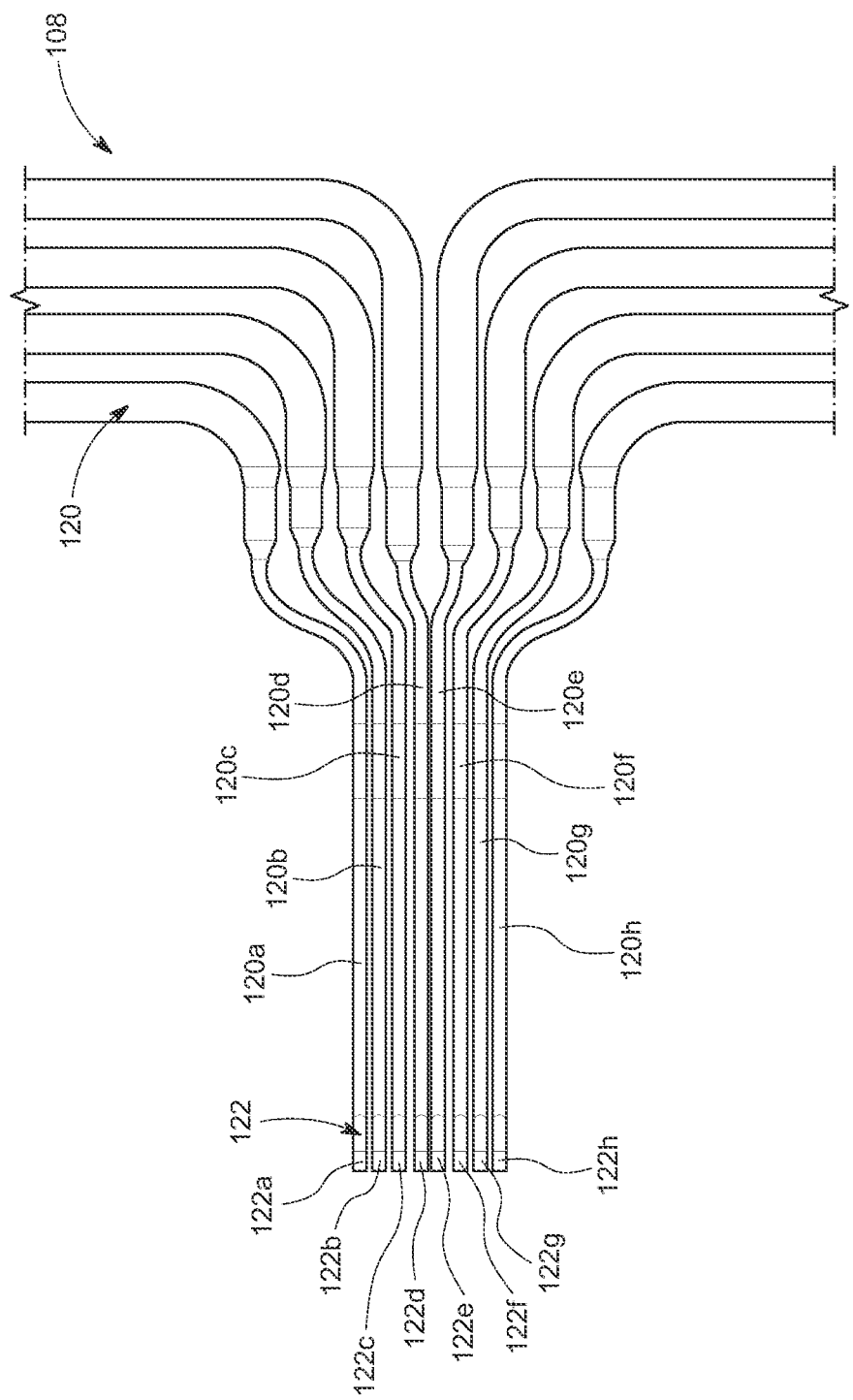
FIG. 5 is a top view of a heat-pipe module, in accordance with an embodiment of the present disclosure.

Referring to FIG. 5, the heat-pipe module 108 includes 8 individual heat pipes 120 configured for transferring, cumulatively, a heat in the range of about 350 W~400 W. Each of the heat pipes 120 has a first end 122 that is next to and in contact with an adjacent first end 122. More specifically, for example, a first end 122*a* of a first heat pipe 120*a* is adjacent to a first end 122*b* of a second heat pipe 120*b*; the first end 122*b* of the second heat pipe 120*b* is further adjacent to a first end 122*c* of a third heat pipe 120*c*; and so on. Thus, except for the first ends 122*a*, 122*h* of the 2 external heat pipes 120*a*, 120*h*, each respective first end 122*b*-120*g* of the 6 internal heat pipes 120*b*-120*g* is in contact with two other adjacent first ends 122*a*-120*h*.

Figure 6:
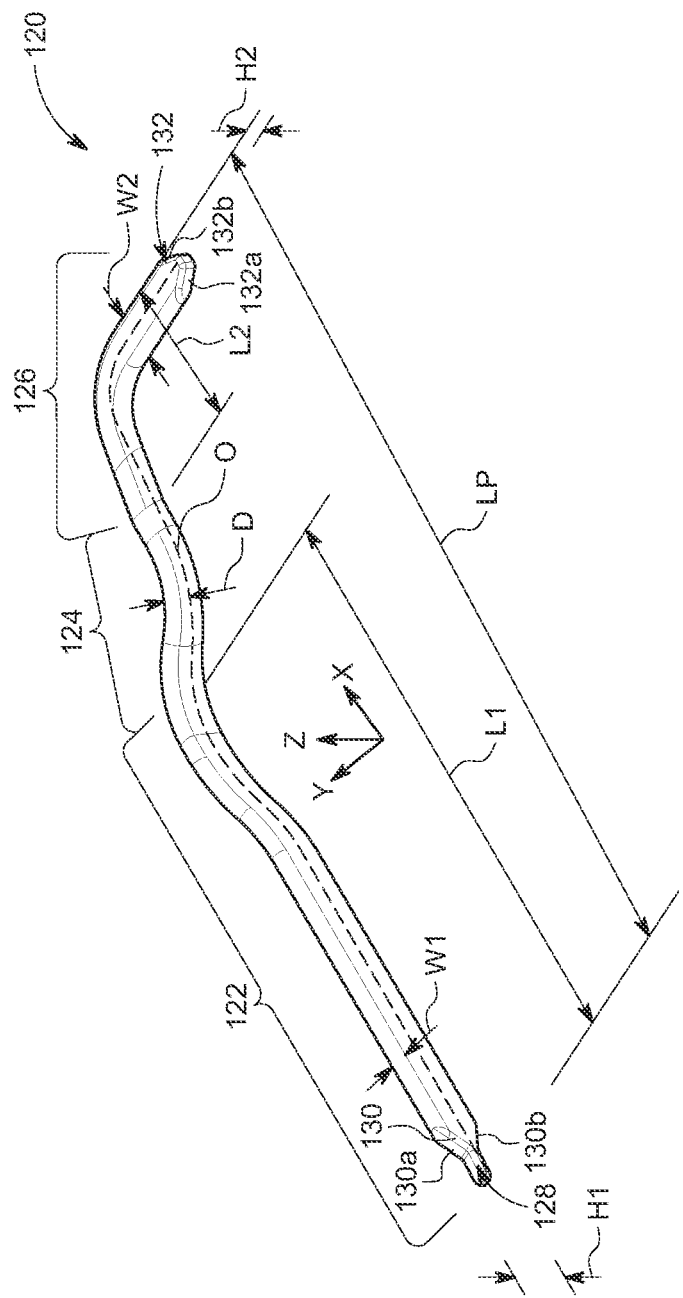
FIG. 6 is a perspective view of a heat pipe, in accordance with an embodiment of the present disclosure.
Figure 7:
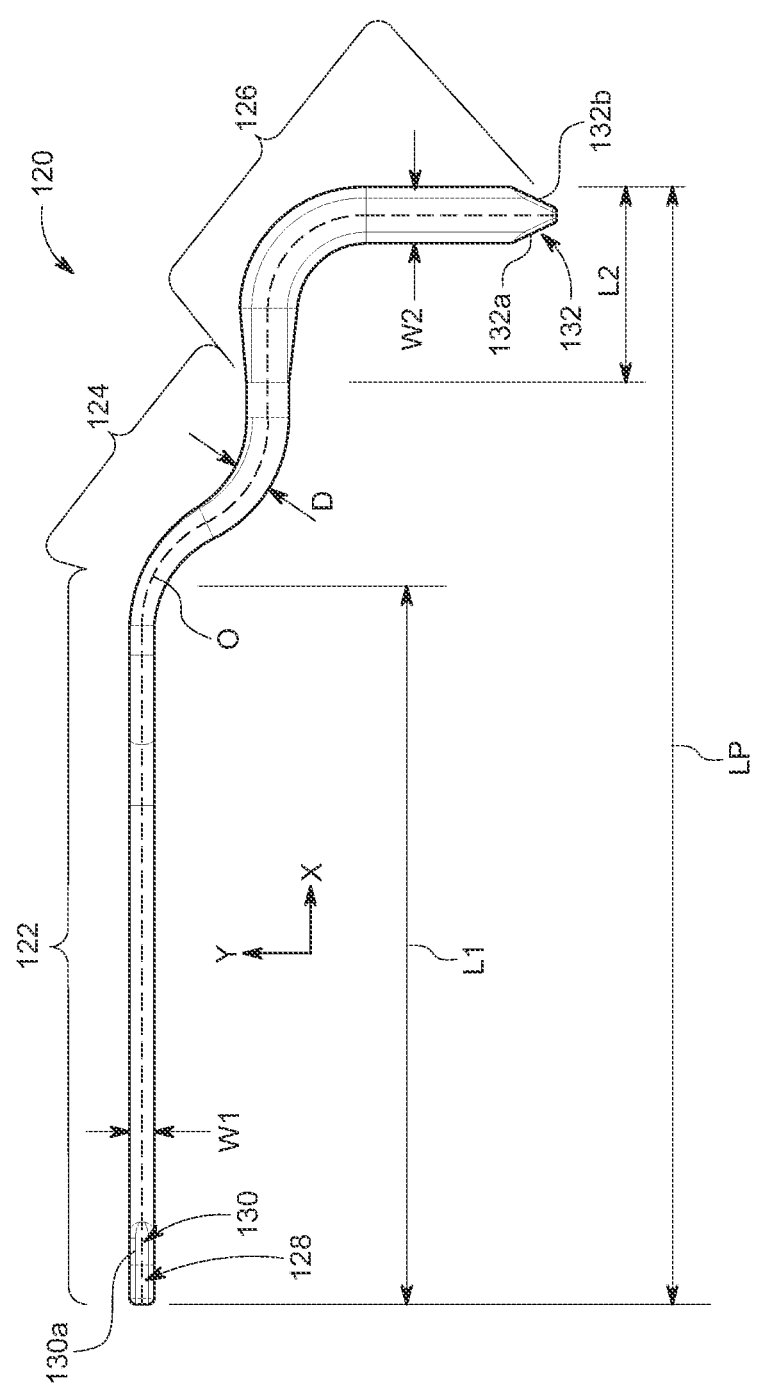
FIG. 7 is a top view of the heat pipe shown in FIG. 6.

Referring to FIGS. 6 and 7, each heat pipe 120 has a circular section 124 that extends between the first end 122 and a second end 126. The circular section 124 has a diameter D that generally defines its cross-section. According to a specific example, the diameter D is approximately 8 mm.

Each heat pipe 120 has a length LP that extends along an X-axis. The X-axis is defined in accordance with a perpendicular XYZ-axis system, and is different from a central axis O, which generally follows the shape of the heat pipe 120, curving (for example) along the X-axis and the Y-axis. The central axis O is centered within the cross-sectional profile of the heat pipe 120, regardless of the shape of the heat pipe 120 at any point along the length LP (e.g., circular, rectangular, square).

According to one specific example, the length LP is approximately 250 mm. Optionally, the length LP is an average length of all the heat pipes 120.

The first end 122 has a flattened, non-circular cross-sectional shape that is defined by a width W1 along a Y-axis, a height H1 (only shown in FIG. 6) along a Z-axis, and a length L1 along the X-axis.

According to a specific example, the width W1 is approximately 4.5 mm, which is achieved by flattening the diameter D of approximately 8 mm. According to another specific example, the height H1 is approximately 10.55 mm. According to yet another specific example, the W1 is less than the height H1 and less than the diameter D.

The second end 126 has a flattened, non-circular cross-sectional shape that is defined by a width W2 generally along the Y-axis, a height H2 (only shown in FIG. 6) along the Z-axis, and a length L2 generally along the X-axis. According to a specific example, the width W2 is greater than the height H2 and/or greater than the diameter D. According to another specific example, the width W2 is greater than the width W1. According to yet another specific example, the height H2 is less than the height H1.

In accordance with an optional embodiment, the first end 122 includes a straight section 128 that extends from a first tapered section 130, which has two first tapered sides 130*a*, 130*b* (first tapered side 130*b* shown only in FIG. 7). In accordance with another optional embodiment, the second end 126 has a second tapered end 132 with two second tapered sides 132*a*, 132*b*.

Figure 8:
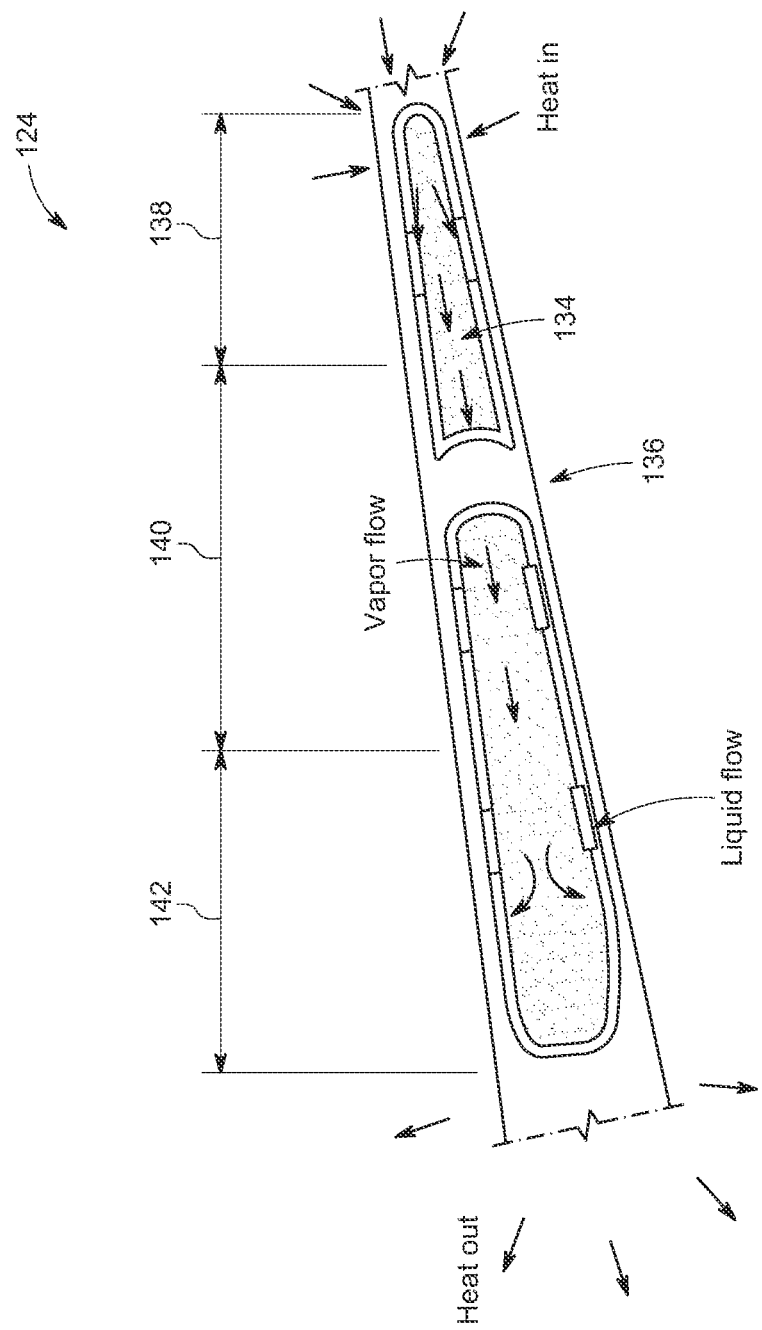
FIG. 8 is a perspective view of a circular section representative of the heat pipe shown in FIG. 6.

Referring to FIG. 8, a representative illustration of the circular section 124 includes an internal wick structure 134 within a tube 136. According to this example, heat is received in an evaporator section 138 from the first end 122 (shown in FIG. 6). The heat flows in vapor form through an adiabatic section 140, from the evaporator section 138 to a condenser section 142. In the condenser section 142, the vapor is condensed to liquid, as heat exits in the remote heat sink 106 (shown in FIG. 2) at the second end 126 (shown in FIG. 6). The liquid flows back through the adiabatic section 140 to the evaporator section 138, in a continuous cooling cycle.

Figure 9:
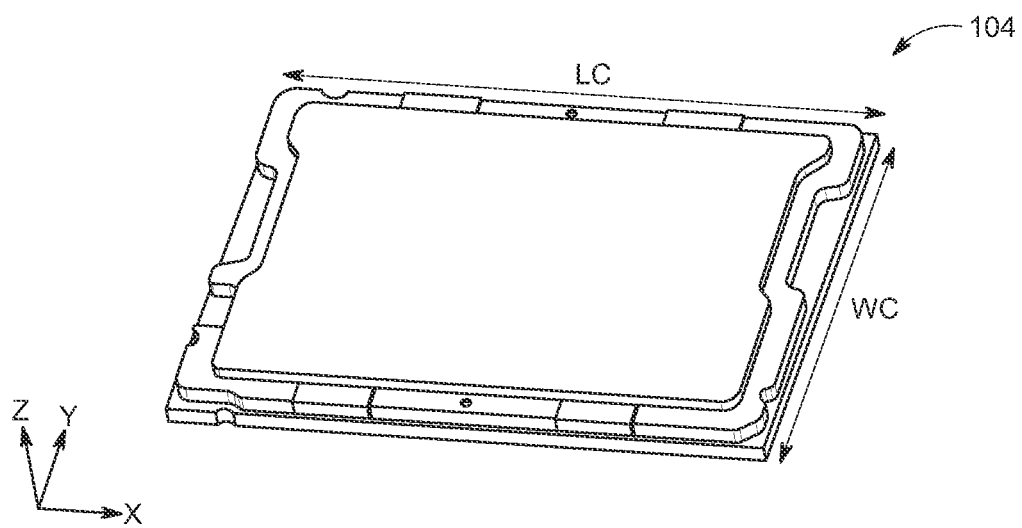
FIG. 9 is a perspective view of a CPU, in accordance with an embodiment of the present disclosure.

Referring to FIG. 9, according to one example, the CPU 104 has a length LC of approximately 77.5 mm and a width WC of approximately 56.6 mm. According to another example, the CPU 104 is a Sapphire Rapids CPU. The CPU 104 has a rectangular shape dimensioned for mounting to the base 110 (shown in FIG. 4). The CPU 104 generates the heat of about 350 W~400 W, which requires the cooling solution of the present disclosure.

Figure 10:
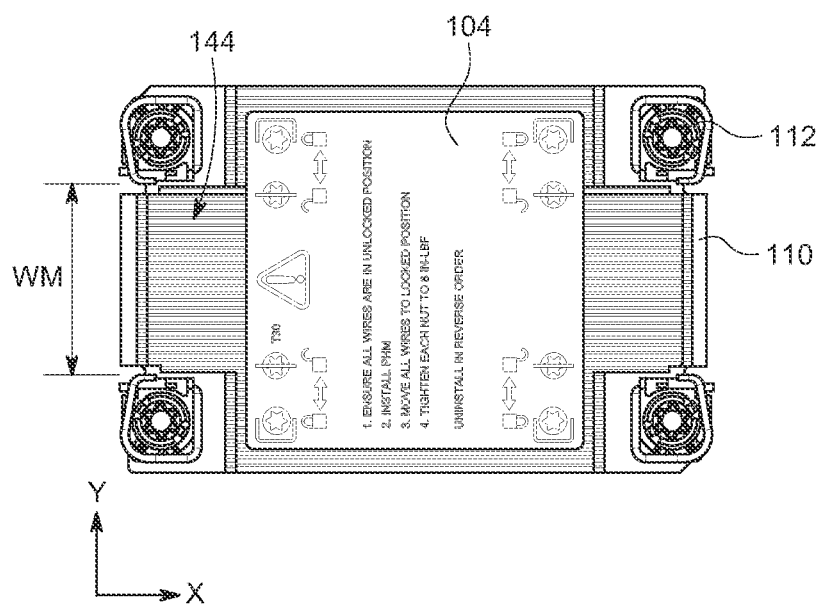
FIG. 10 is a top view of the CPU of FIG. 9 mounted to a base, in accordance with an embodiment of the present disclosure.

Referring to FIG. 10, the CPU 104 is mounted to the base 110 and the anti-tilt system 112. The base 110 provides a mounting space 144 above the CPU 104. The mounting space 144 has a width WM that extends along the Y-axis. According to one example, the width WM is approximately 38 mm. According to a more specific example, the width WM is 38.2 mm.

Figure 11:
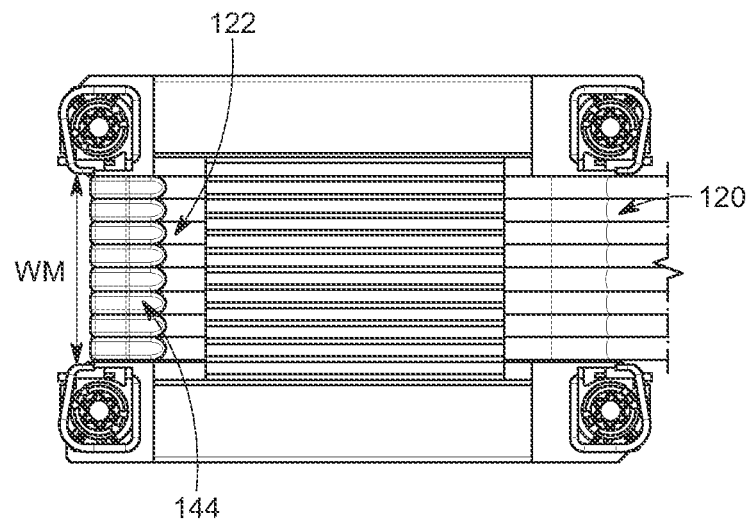
FIG. 11 is a top view of a heat-pipe first end attached to the base, in accordance with an embodiment of the present disclosure.

Referring to FIG. 11, the first end 122 of the heat pipes 120 is attached within the mounting space 144. As illustrated, the flattened, non-circular shape of the first end 122 facilitates the receipt of the heat pipes 120 fits within the limited dimension WM of the mounting space 144.

Figure 12:
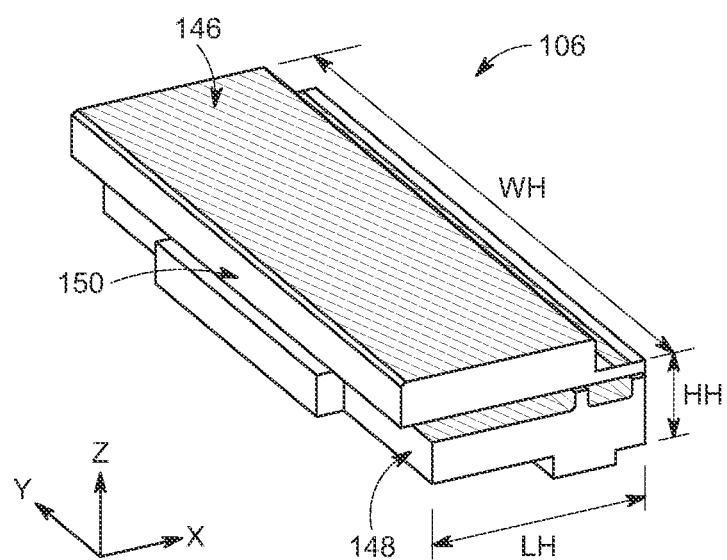
FIG. 12 is a perspective of a remote heat sink, in accordance with an embodiment of the present disclosure.

Referring to FIG. 12, the remote heat sink 106 is generally defined by a width WH, a length LH, and a height HH. According to one example, the width WH is approximately 167 mm; the length LH is approximately 64 mm; and the height HH is approximately 35 mm. The remote heat sink 106 has a top region 146 and a bottom region 148. In-between the top and bottom regions 146, 148, the remote heat sink 106 has a pipe-receiving region 150 in which the second end 126 (shown in FIG. 6) is attached. The remote heat sink 106 receives at least a portion of the heat generated by the CPU 104 (illustrated in FIG. 3).

Figures 13, 14:
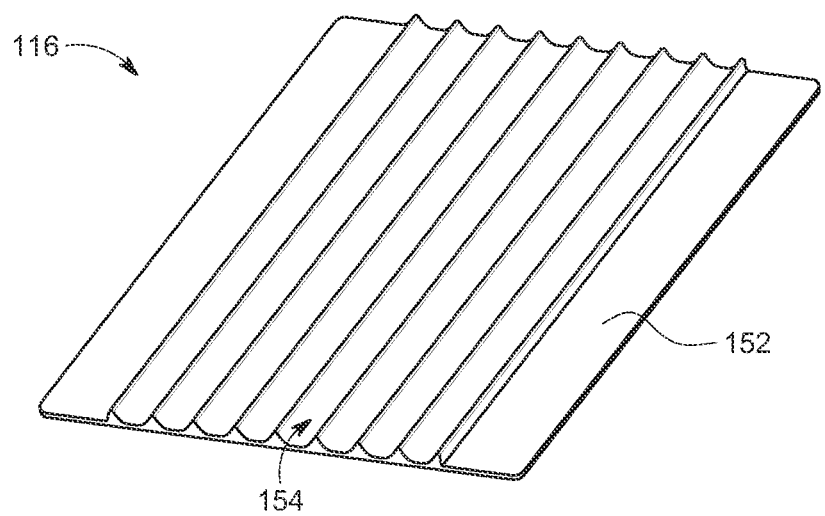
FIG. 13 is a perspective view of a copper block, in accordance with an embodiment of the present disclosure.
FIG. 14 is a table showing a thermal resistance R for heat-pipe modules with a different number of heat pipes.

Referring to FIG. 13, the copper block 116 includes a top surface 152 on which a plurality of channels 154 are formed. The channels 154 are formed to receive, respectively, the first ends 122 of the heat pipes 120 (shown in FIG. 5). The copper block 116 is mounted between the first end 122 of the heat pipes 120 (shown in FIG. 5) and the CPU 104 (shown in FIG. 3) for distributing the heat generated by the CPU 104 to the first end 122 of each heat pipe 120. According to one example, the copper block 116 is in direct contact with the first end 122 (shown in FIG. 5) and the CPU 104 (shown in FIG. 3). According to another example, each channel 154 has a cross-sectional profile that is in the form of a half-circle. One benefit of the half-circle profile is that it provides an enhanced direct contact between the copper block 116 and the respective first end 122 (shown in FIG. 5). Notably, the copper block 116 is an optional component. According to some embodiments, direct contact is achieved between the first end 122 (shown in FIG. 5) and the CPU 104 (shown in FIG. 3).

Referring to FIG. 14, a table shows that a desired heat thermal R of approximately 0.0900 is achieved with a heat-pipe module having 8 heat pipes. The thermal resistance R of 0.09 or less is desired for adequately cooling a heat low of 350 W. In contrast, heat-pipe modules having 6 or less heat pipes have a much higher resistance R of approximately 0.1091-0.1938. The table shows a thermal design evaluation for the Smiling Pond 4 thermal test vehicle (TTV), which is an Intel Purley platform CPU. The design has a volume air flow of 60 cubic feet per minute (CFM), with a surface temperature Tc of the CPU, and an ambient temperature Ta. The power is illustrated in W units, while the thermal resistance R is in degrees Celsius/W.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cooling system for an electronic device, the cooling system comprising:
 a central processing unit (CPU) mounted on a base of the electronic device;
 a remote heat sink for receiving heat generated by the CPU, the remote heat sink being separate from the electronic device; and
 a heat-pipe module having a plurality of heat pipes for transferring the heat generated by the CPU to the remote heat sink, each heat pipe of the plurality of heat pipes having a circular section extending between a first end and a second end, the circular section extending over an air gap between the CPU and the remote heat sink, the first end having a flattened, non-circular shape, the first end being coupled to the base near the CPU, the second end being coupled to the remote heat sink, the first end of each heat pipe being in direct contact with at least another first end of an adjacent heat pipe, the second end having a flattened, non-circular shape that is perpendicular to the flattened, non-circular shape of the first end, wherein the first end reduces a general circular diameter of the circular section.

2. The cooling system of claim 1, wherein the plurality of heat pipes includes eight heat pipes.

3. The cooling system of claim 1, wherein each one of the plurality of heat pipes includes an internal wick structure transferring heat between the first end and the second end, the internal wick structure including a liquid.

4. The cooling system of claim 3, wherein, in response to the heat produced by the CPU, the first end evaporates, at least in part, the liquid into vapor, the second end condensing the vapor into liquid, the internal wick structure transmitting the vapor and liquid between the first end and the second end.

5. The cooling system of claim 1, wherein the first end of each heat pipe has a width W1 of approximately 4.5 millimeters (mm).

6. The cooling system of claim 1, wherein a cumulative width WT for all first ends of the plurality of heat pipes is less than approximately 38.2 millimeters (mm).

7. The cooling system of claim 1, wherein the heat is in the range of about 350-400 watts.

8. The cooling system of claim 1, wherein the heat-pipe module has a thermal resistance R of about 0.09 or less.

9. The cooling system of claim 1, wherein each heat pipe has a length LP that extends between the CPU and the remote heat sink along an X-axis, the circular section having a cross-section with a diameter D, the first end having a width W1 that extends along a Y-axis, the width W1 of the first end being less than the diameter D of the circular section, the first end having a height H1 that extends along a Z-axis, the Z-axis being perpendicular to the Y-axis.

10. The cooling system of claim 9, wherein the length LP is approximately 250 millimeters (mm), the width W1 is approximately 4.5 mm, the diameter D is approximately 8 mm, and the height H1 is approximately 10.55 mm.

11. The cooling system of claim 9, further comprising a copper block mounted between the first end of the heat-pipe module and the CPU, the copper block having a plurality of channels for receiving, respectively, the plurality of heat pipes.

12. The cooling system of claim 11, wherein the copper block is in direct contact with the first end of the heat-pipe module and the CPU.

13. The cooling system of claim 11, wherein each channel of the plurality of channels has a cross-sectional profile in the form of a half-circle.

14. The cooling system of claim 1, wherein the second end having a width W2 that extends along a Y-axis, the second end having a height H2 that extends along a Z-axis, the Z-axis being perpendicular to the Y-axis, the width W2 of the second end being greater than the height H2 of the second end.

15. A cooling system for an electronic device, the cooling system comprising:
a central-processing unit (CPU) that generates heat;
a base in which the CPU is positioned, the base including a mounting space above the CPU, the mounting space having a width WM that extends along a Y-axis, the width WM of the mounting space being approximately 38 millimeters (mm);
a heat sink for receiving heat generated by the CPU, the heat sink being separate from the CPU; and
a heat-pipe module having eight individual heat pipes, each heat pipe of the eight individual heat pipes having a first end that is attached within the mounting space, the first end having a non-circular shape, each heat pipe having a circular section that connects the first end to a second end, the second end being attached to the heat sink the circular section extending over an air gap between the CPU and the heat sink, the second end having a flattened, non-circular shape that is perpendicular to the flattened, non-circular shape of the first end, wherein the first end reduces a general circular diameter of the circular section.

16. The cooling system of claim 15, wherein the first end has a width W1 that extends along the Y-axis, the first end having a height H1 that extends along a Z-axis, the Z-axis being perpendicular to the Y-axis the width W1 of the first end being smaller than the height H1 of the first end.

17. The cooling system of claim 15, wherein the second end having a width W2 that extends along the Y-axis, the second end having a height H2 that extends along the Z-axis, the width W2 of the second end being greater than the height H2 of the second end.

18. The cooling system of claim 15, wherein the first end is attached to the mounting space in direct contact with the CPU.

19. The cooling system of claim 15, further comprising a copper block mounted between the first end of each heat pipe and the CPU, the copper block distributing the heat generated by the CPU to the first end of each heat pipe.

20. The cooling system of claim 15, wherein the first end of each heat pipe is in direct contact with at least one other first end of an adjacent heat pipe of the eight individual heat pipes.

* * * * *